(12) United States Patent
Varughese

(10) Patent No.: US 10,565,331 B2
(45) Date of Patent: Feb. 18, 2020

(54) ADAPTIVE MODELING OF DATA STREAMS

(71) Applicant: International Business Machines Corporation, Armonk, NY (US)

(72) Inventor: Melvin Mathew Varughese, Cape Town (ZA)

(73) Assignee: International Business Machines Corporation, Armonk, NY (US)

( * ) Notice: Subject to any disclaimer, the term of this patent is extended or adjusted under 35 U.S.C. 154(b) by 379 days.

(21) Appl. No.: 15/660,988

(22) Filed: Jul. 27, 2017

(65) Prior Publication Data

US 2019/0034565 A1    Jan. 31, 2019

(51) Int. Cl.
G06F 17/50    (2006.01)
G06F 17/11    (2006.01)

(52) U.S. Cl.
CPC .......... *G06F 17/5009* (2013.01); *G06F 17/11* (2013.01)

(58) Field of Classification Search
CPC ....... G06F 17/5009; G06F 17/11; G06F 17/18
See application file for complete search history.

(56) References Cited

U.S. PATENT DOCUMENTS

| | | | |
|---|---|---|---|
| 9,183,512 B2 | 11/2015 | Lehmann et al. | |
| 9,619,594 B1 * | 4/2017 | Dow | G06F 17/5009 |
| 9,843,596 B1 * | 12/2017 | Averbuch | H04L 63/1416 |
| 9,942,254 B1 * | 4/2018 | Averbuch | H04L 63/1425 |
| 2003/0065409 A1 | 4/2003 | Raeth et al. | |
| 2012/0072456 A1 | 3/2012 | Dube et al. | |

OTHER PUBLICATIONS

Varughese, Melvin M., "Parameter estimation for multivariate diffusion systems," Computational Statistics and Data Analysis 57 (2013) (Year: 2013).*
Aggarwal, "On Abnormality Detection in Spuriously Populated Data Streams", Proceedings of the 2005 SIAM International Conference on Data Mining, 2005.
Bandi et al., "Fully Nonparametric Estimation of Scalar Diffusion Models", Econometrica, Jan. 2003, pp. 241-283, vol. 71, Issue 1.
Stephanou et al., "Sequential Quantiles via Hermite series Density Estimation", Electronic Journal of Statistics, 2017, vol. 11, pp. 570-607.
Takeuchi et al., "A Unifying Framework for Detecting Outliers and Change Points from Time Series", IEEE Transactions on Knowledge and Data Engineering, Apr. 2006, vol. 18, No. 4, pp. 482-492.

* cited by examiner

Primary Examiner — Rehana Perveen
Assistant Examiner — Steven W Crabb
(74) Attorney, Agent, or Firm — Adams & Adams

(57) ABSTRACT

A computer-implemented method for adaptive modeling of a data stream is provided. The method may comprise receiving a plurality of data points forming part of a data stream and providing a predictive model to be fitted to the data stream. The predictive model may be a diffusion model having a plurality of diffusion parameters. A parameter estimate for each one of the diffusion parameters may be updated by obtaining a sample of at least one transition from the data stream and calculating an updated parameter estimate for the diffusion parameter by using a stochastic gradient descent algorithm on the sample. The updating of the parameter estimate may be repeated periodically or in response to one or more further data points being added to the data stream, thereby to permit adaptive estimation of the diffusion parameters of the diffusion model based on dynamics of the data stream.

20 Claims, 5 Drawing Sheets

ADAPTIVE MODELING OF DATA STREAMS

BACKGROUND

The present invention relates to data stream analysis and it relates specifically to a computer-implemented method for adaptive modeling of a data stream.

It is often necessary or desirable to analyze a data stream, such as a data stream originating from a real-time physical sensor, a currency feed or a computer system, in order to identify potential anomalies, detect regime shifts, monitor risk factors, make predictions, or the like. A common technique used in data stream analysis is the fitting of a statistical model to a particular data stream, thereby to approximate underlying dynamics of the data stream.

In the context of this specification, the term "data stream" may be used to refer to a data stream comprising real numbers only and does not encompass non-numeric data streams. Furthermore, the terms "observation" and "data point" are interchangeably used to refer to individual components of a data stream.

SUMMARY

According to an example embodiment of the present invention, there is provided a computer-implemented method comprising receiving, by a receiving module of a computer processor, a plurality of data points forming part of a data stream. The method may comprise providing a predictive model to be fitted to the data stream. The predictive model may be a diffusion model having a plurality of diffusion parameters. The method may comprise, for each one of the diffusion parameters, updating, by an updating module of the computer processor, a parameter estimate for the diffusion parameter. The updating of the parameter estimate for a particular one of the diffusion parameters may comprise obtaining a sample of at least one transition from the data stream. Each transition may be defined by at least two data points. The updating of the diffusion parameter may further comprise calculating an updated parameter estimate for the diffusion parameter by using a stochastic gradient descent algorithm on the sample. A partial derivative associated with the diffusion parameter may be calculated while holding values associated with the other diffusion parameters at smoothed or weighted average estimates. The method may comprise periodically, or in response to one or more further data points being added to the data stream, repeating, by the updating module, the updating of the parameter estimate for each one of the diffusion parameters, thereby to permit adaptive estimation of the diffusion parameters of the diffusion model based on dynamics of the data stream.

Example embodiments of the present invention extend to a corresponding system and a computer program product.

DETAILED DESCRIPTION

With the rise of technology such as the "Internet of things" (IoT), data streams are becoming commonplace in many applications. In the Applicant's experience, in cases where an evolving data stream is driven by non-stationary dynamics and/or is of relatively high velocity (e.g. where the time between successive observations in the data stream may be less than one second), fitting a predictive model to a data stream may be a challenging and/or computationally intensive exercise. It has further been found that existing predictive models may in some cases be unsuitable for facilitating real-time decision-making.

The Applicant has found that a predictive model suitable for short-term decision-making should be capable of responding to changes in the underlying dynamics of a data stream substantially in real-time. Accordingly, in order to identify potential anomalies, detect regime shifts in the dynamics of the data stream and/or to make sound predictions about the future behavior of a data stream, an adaptive model may be required.

An embodiment of the present invention provides a method for adaptively fitting a predictive model to a data stream. The method may allow for the drift and volatility of the predictive model to be driven by the latest data stream observations. According to an embodiment of the present invention, a real-time adaptive method is provided in an online manner that aims to provide a reliable approximation of non-stationary, stochastic dynamics that drive a data stream. Such method may enable a user to make informed, time-critical decisions within an uncertain environment. In embodiments of the present invention, the method may be based on the diffusion model—a class of stochastic model which may allow for non-linear interactions in both its drift and random components.

Figure 1:
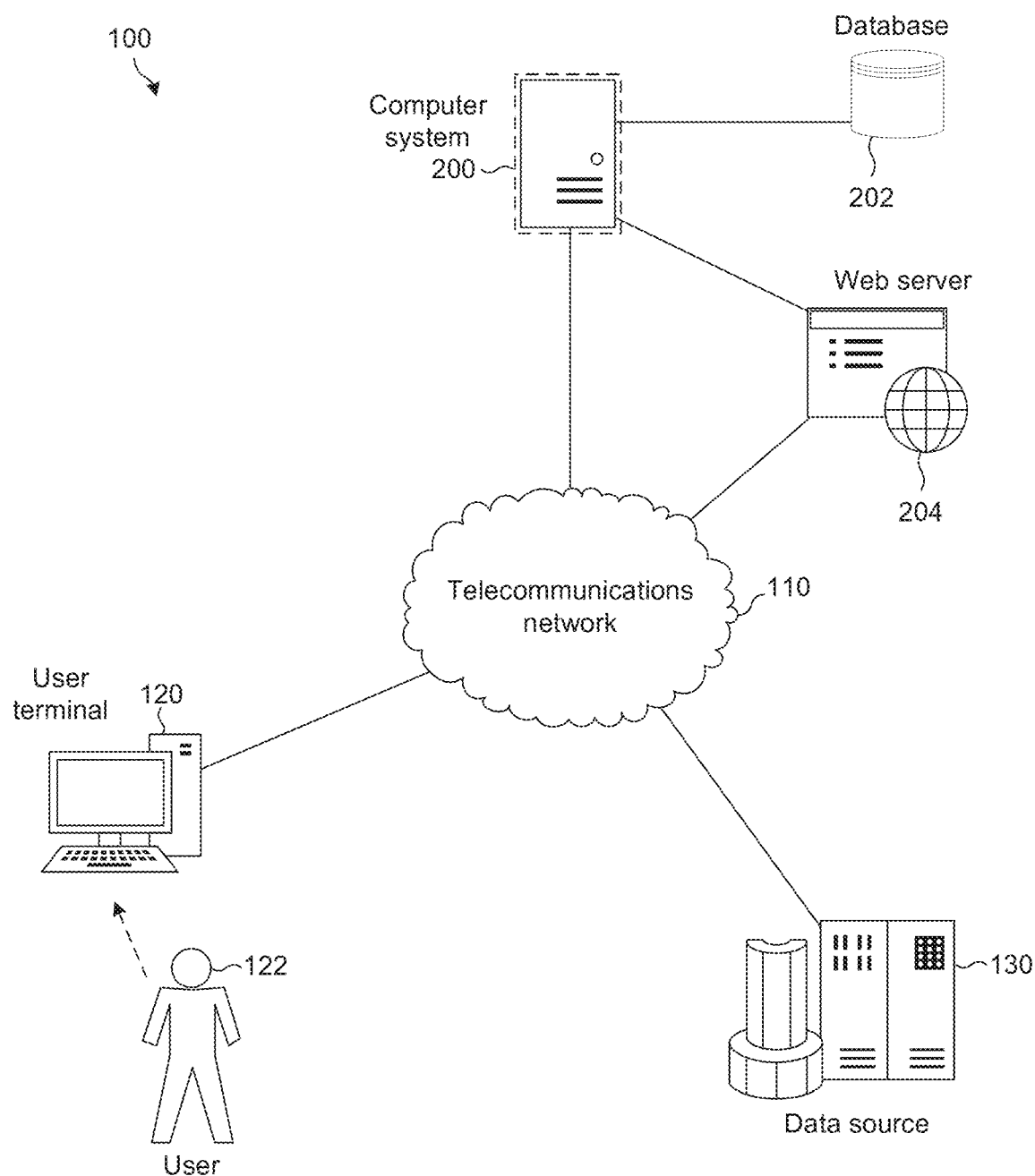
FIG. 1 illustrates a network topology comprising a computer system for adaptive modeling of a data stream, in accordance with an embodiment of the invention.

With reference now to FIG. 1, a network topology 100 includes a computer system 200 for adaptive modeling of a data stream, in accordance with an embodiment of the invention. The computer system 200 is described in more detail (below) with reference to FIG. 2 and comprises (either integral therewith or separate and networked thereto) a database 202. The computer system 200 may also comprise (either integral therewith or separate and networked thereto) a web server 204.

The computer system 200 may be communicatively coupled to a telecommunications network 110 which may be, or at least include, the internet. Accordingly, the computer system 200 may be connectable to remote computerized devices which are also coupled to the telecommunications network 110. For example, a user terminal 120 may connect to, and access, the computer system 200 via the telecommunications network 110 under control/direction of a user 122. The user terminal 120 may be a computer (e.g., desktop, laptop, tablet, mobile phone, etc.).

The topology 100 may further include a data source 130 configured to communicate with the computer system 200 via the telecommunications network 110. The data source 130 may, for example, be a real-time physical sensor or a computer system configured to feed a data stream to the computer system 200. The data stream may be fed to the computer system 200 substantially in real-time (e.g. as it is updated or "evolving" over time).

Figure 2:
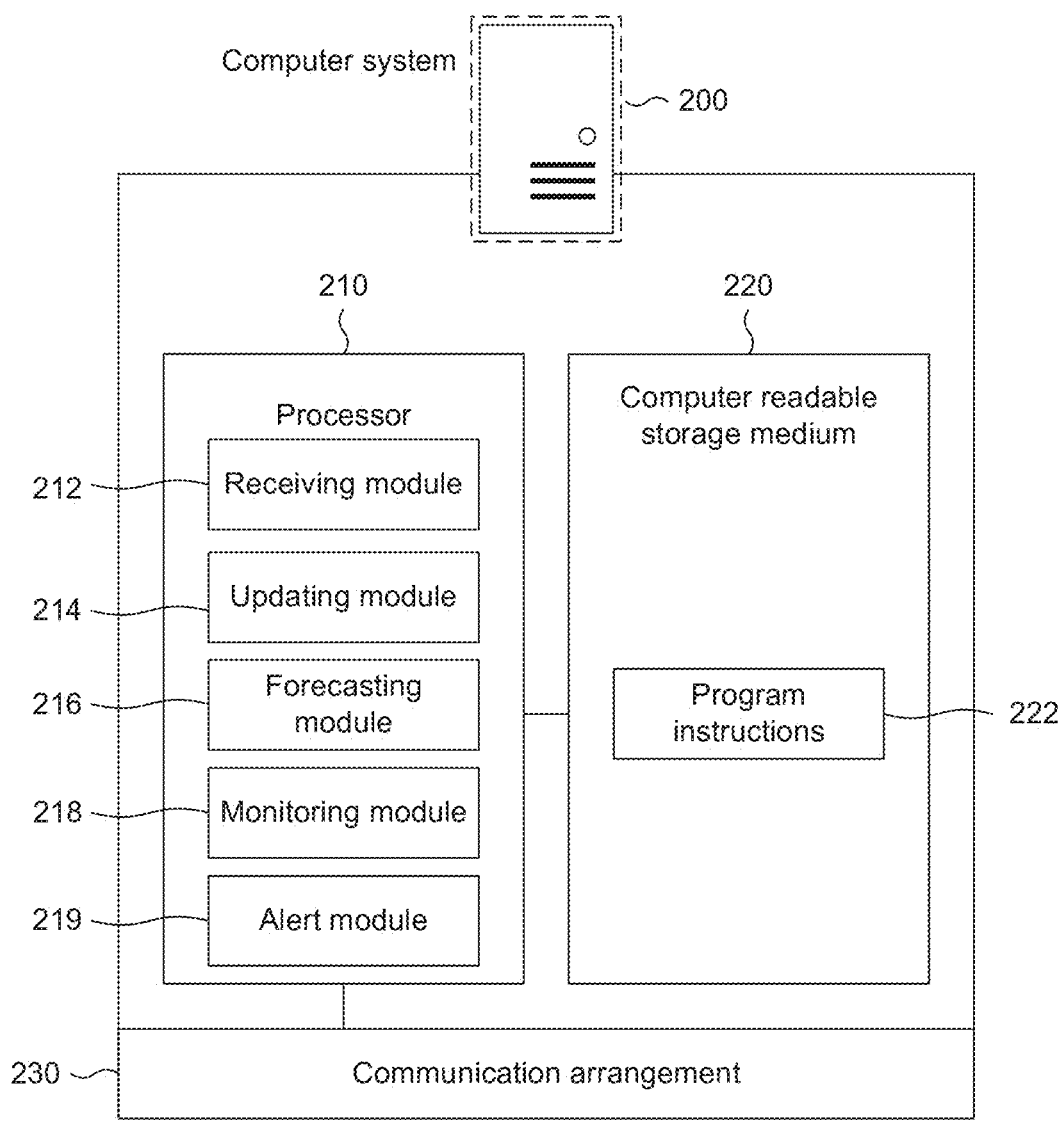
FIG. 2 illustrates a schematic view of the computer system of FIG. 1 in greater detail.

With reference now to FIG. 2, the computer system 200 includes a processor 210 and a computer readable storage medium 220. The processor 220, under the direction of program instructions 222 stored on the computer readable medium 220, comprises a plurality of conceptual modules 212, 214, 216, 218, 219 which may correspond to functional tasks performed by the processor 210.

A receiving module 212 may be configured to receive a plurality of data points forming part of the data stream. The receiving module 212 may further be configured to cause at least some of the data points to be stored in the database 202. In other embodiments, the receiving module 212 may be or form part of the database 202. The data stream may be an evolving data stream and the receiving module 212 may thus receive new data points continuously or periodically.

An updating module 214 may be configured to update a parameter estimate for each one of a plurality of diffusion parameters of a diffusion model, as will be described in greater detail with reference to FIG. 3 below.

A forecasting module 216 may be provided. The forecasting module 216 may be configured to forecast future data points associated with a data stream using parameter estimates dynamically updated by the updating module 214.

A monitoring module 218 may be provided. The monitoring module 218 may be configured to analyze the data stream and to detect a risk event, an opportunity event, a regime change and/or an anomaly associated with the data stream. Analysis of the data stream may include analysis of the future data points.

An alert module 219 may be provided. The alert module 219 may be configured to provide an alert message to the user 122 via the user terminal 120 in response to detecting the risk/opportunity event, regime change and/or anomaly.

The computer system 200 further comprises a communication arrangement 230 which enables communication or networking with other systems, devices, or nodes, either directly or via a telecommunications network, e.g. the telecommunications network 110. In this example embodiment, the communication arrangement 230 may be a network interface operable to connect the computer system 200 to the database 202 and/or to the telecommunications network 110 for communication with the database 202 and/or the user terminal 120 and/or the data source 130 and/or the web server 204.

The web server 204 may be configured to generate, store, process and/or deliver a web page to a client. This is described in greater detail with reference to FIGS. 4 and 5 below.

Figure 3:
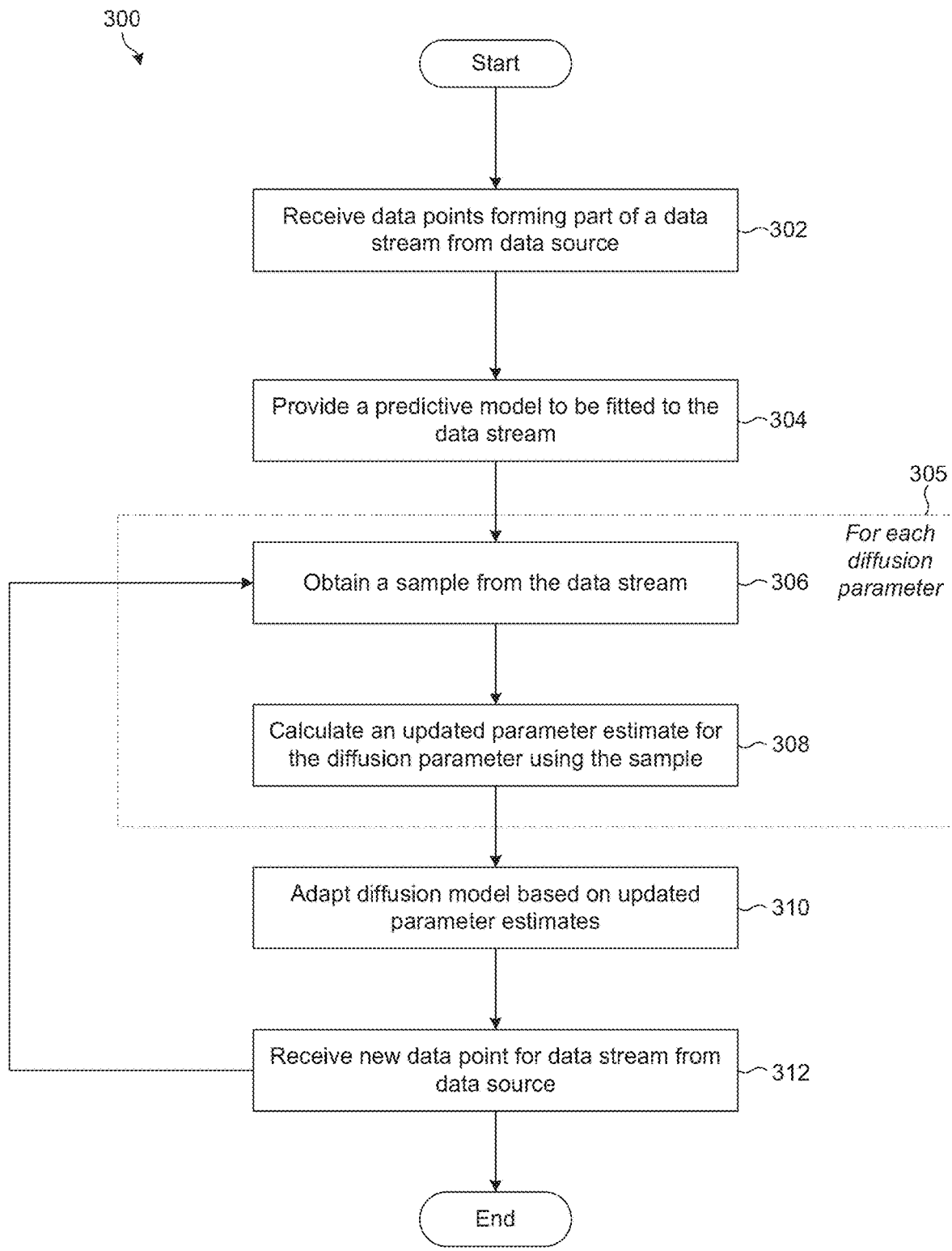
FIG. 3 illustrates a flow diagram of a method for adaptive modeling of a data stream, in accordance with an embodiment of the invention.

An embodiment of the invention will now be further described in use, with reference to FIG. 3.

FIG. 3 illustrates a flow diagram of a method 300 for adaptive modeling of a data stream, in accordance with an embodiment of the invention. The method 300 may be implemented by the computer system 200, and is described in this manner below; however, it is understood that the method 300 may be implemented by a different computer system and that the computer system 200 may be configured to implement a different method.

A plurality of data points forming part of a data stream are received from the data source 130 by the receiving module 212 (at block 302). Observations in the data stream may be equally or unequally spaced in time. The data stream may be a relatively high-velocity data stream and may have an arbitrary rate of incoming observations. The data stream's volatility may have a non-linear dependence on time and/or on previous observations.

A predictive model is provided for adaptive fitting to the data stream (at block 304). In this example embodiment, the predictive model is a diffusion model having a plurality of diffusion parameters. Examples of diffusion processes include the Ornstein-Uhlenbeck process, which may be used to model commodity prices or exchange rates, the Cox-Ingersoll-Ross process, which may be used to model interest rates, the Jacobi process, which may be used to model proportion of drug-resistant viruses within a virus population, geometric Brownian motion, which may be used to model asset prices, and the birth-death process, which may be used to model population abundance (the above processes and applications being provided as non-limiting examples).

The method may entail conducting initial exploratory analysis to determine the appropriate type of diffusion process for the data stream. Once an appropriate diffusion model is determined, the technique (blocks 306 to 312) is continued using the determined diffusion model. Alternatively, a set of candidate diffusion processes may be provided, each of which is then updated over time using the proposed technique (blocks 306 to 312). In such cases, for each of the candidate diffusion processes, a running estimate of its predictive power may be kept, e.g. over a fixed future horizon. The model with the best predictive power may then be selected in real-time and provided as output, e.g. to the user 122 via the user terminal 120.

A parameter estimate for each diffusion parameter of the diffusion process to be fitted is updated by the updating module 214 (as indicated by block 305). The updating step may include sampling and calculation of an updated parameter estimate based on the sample.

For each diffusion parameter, a sample of at least one transition is obtained from the data stream (at block 306). Each transition may be defined by at least two data points. In this example, a transition is defined as the move of the data stream from an earlier observed value to its succeeding value. In other embodiments, a transition may be defined as the move between non-succeeding observations and/or the move between a plurality of observations.

The receiving module 212 may receive an indication of a sampling distribution to use for the particular diffusion parameter. The receiving module 212 may also receive an indication of a sample size associated with the particular parameter. These indications may be received from the user 122 via the user terminal 120. The updating module 214 may then obtain the sample in accordance with the sampling distribution associated with the diffusion parameter and/or include in the sample a number of transitions corresponding to the sample size associated with the diffusion parameter.

Accordingly, the framework may allow the user 122 to choose the sampling distribution and/or the number of transitions that are to be sampled for each parameter update. This may allow the user 122 to balance a trade-off: a larger number of transitions may enable one to drive down the variance of the model fit, but increases the cost of a parameter update.

The sampling distribution may be defined by a sliding and/or decaying probability distribution that generally allocates higher selection probabilities to more recent data points in the data stream.

In some cases, the sampling distribution may be same for all of the parameters and one sample may thus be drawn and used to update all of the parameters (and may be repeated as described below).

In addition to obtaining the sample in accordance with the sampling distribution, or as an alternative thereto, the most recent transition defining the transition to the most recent data point in the data stream may be obtained, such that the sample includes at least one transition obtained in accordance with the sampling distribution as well as the most recent transition. Accordingly, in some cases, the latest observation would necessarily always be included in the sample. This may be done to ensure that every transition is used to estimate the diffusion parameters and that no information is "thrown away" as a result of the inherent randomness in the sampling distribution.

Figure 4:
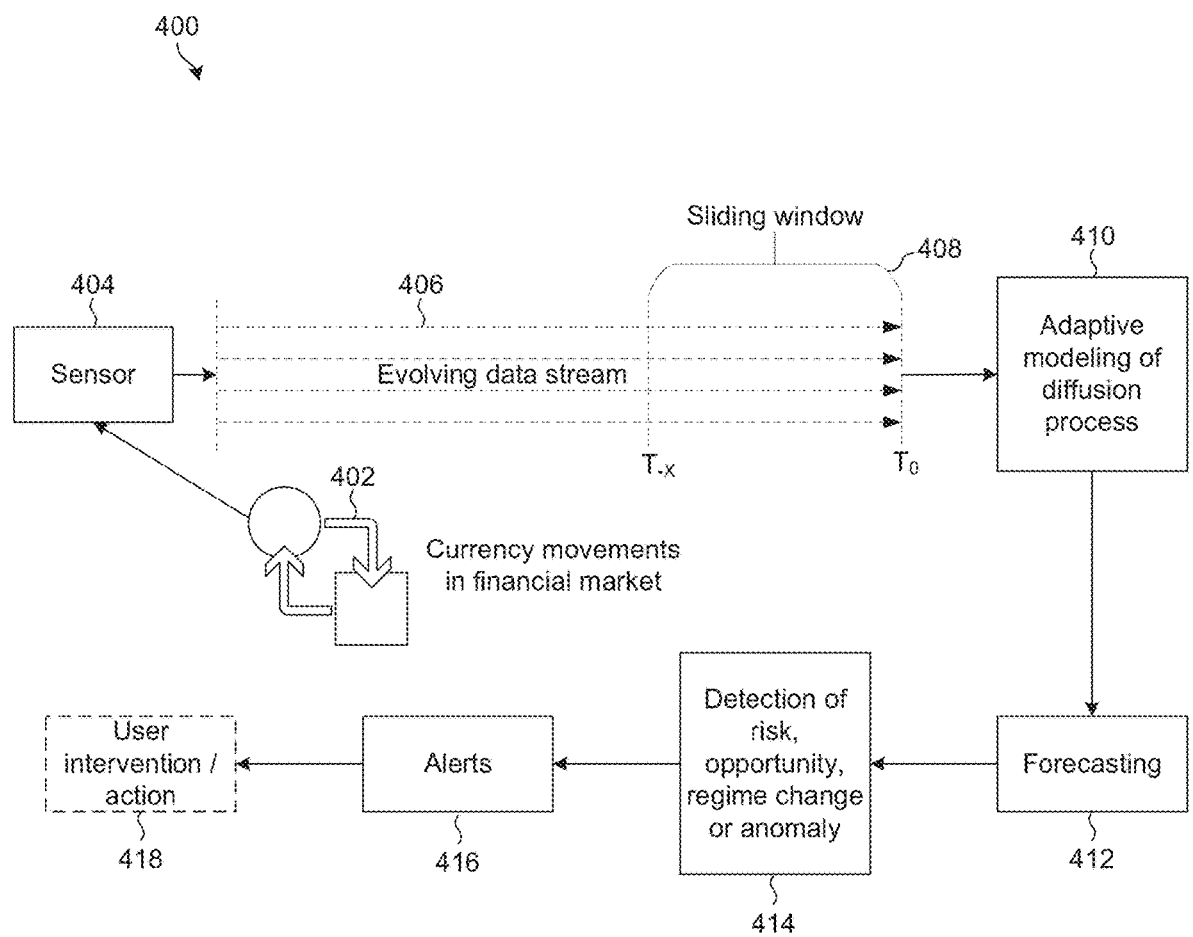
FIG. 4 illustrates a schematic flow diagram of a method for adaptive modeling of a data stream, in accordance with an embodiment of the invention.

To reduce memory requirements associated with the technique, the sampling distribution may be truncated so that observations older than a certain threshold have no chance of being sampled and hence can be safely discarded from memory. In other words, only transitions within a sliding or traveling effective time window associated with the data stream may be capable of being sampled. This is illustrated in FIG. 4, which will be described below.

The sample size and sampling distribution may be updated automatically using, for example, heuristics that are based on past parameter estimates and/or the predictive power of the diffusion model.

A sample size of one may be used to remove randomness. The sampling distribution may be made equal to one at the latest transition in the data stream, e.g. the move from the penultimate to the latest observation, and zero for past transitions. In such cases, only the most recent transition is sampled to update the diffusion parameter in question.

As an example, only the latest observation may be used to form a sample of size of one, as indicated above. If the i-th observation is chosen, it is necessary to calculate the likelihood of the process transitioning from the (i−1)-th observation to the i-th observation under the adaptive diffusion model in question. Such calculations may be performed for each observation within the sample, where the sample may be redrawn each time an observation is added to the data stream.

As another example, the sample may be drawn according to a probability distribution that decays away from the present, as indicated above That is, the latest observation may have the maximum sampling probability with observations further back being less likely to be sampled. For example, in the case where the observations are equally spaced, one may choose—after the n-th data point—that the sampling distribution is given by:

$$p_n^*(u) = K(1-v)^{n-u} v;$$

$$u = n - \tau, \dots, n$$

where:

$$v = 1 - \exp\left(-\frac{\delta}{m}\right).$$

Here, m is interpreted as the number of observations accumulated by the data stream per unit time and δ is the rate of decay of relevance of past observations to the current dynamic. The larger the data accumulation rate is, the closer v is to one. In this case, the relative sampling probabilities of adjacent observations will be closer to each other. The more rapidly changing the underlying dynamic is, the larger δ may be set. A larger δ ensures that a more recent set of observations are sampled from for the parameter update. K is a constant that ensures the sampling distribution normalizes to one and a lower limit n−τ may be imposed on the distribution to ensure that the memory requirements of the updating scheme do not grow with the data stream.

The Applicant has found that, in fitting diffusion models to data streams, some parameters may be more difficult to estimate than others. For instance, with an Ornstein-Uhlenbeck process, the reversion parameter may be more difficult to estimate since when the process is close to the long-term mean (which may be most of the time), the reversion force may be weak and the dynamics will be dominated by noise.

To facilitate the estimation of such parameters, both the sample sizes and the sampling distribution may be allowed to vary by parameter. For the sampling distribution introduced above, only δ may be allowed to vary by parameter. This extra flexibility may make it possible, for "difficult" parameters (e.g. parameters that would otherwise have relatively imprecise estimates), to select a relatively large sample size and set δ smaller in order that the parameters are more likely to access the more informative observations with each update. This may ensure that the parameter is updated using a larger sample with observations drawn over a larger time span.

In some embodiments, the sample sizes and sampling distributions may be predefined and fixed according to the behavior of the data stream.

In some embodiments, if a parameter has highly variable estimates, a rule may be set that enables the sample size to be dynamically increased to bring down the variability of the parameter. If the local variability of a parameter estimate is small, but the parameter's estimates have underlying systematic structure, this may suggest that the dynamics of the data stream (as represented by that particular parameter) are changing rapidly and in such cases the sampling distribution may be updated dynamically to make it less likely to sample "old" observations that are unlikely to be reflective of the current system dynamic.

Once the sample has been obtained from the data stream, an updated parameter estimate is calculated for the particular parameter in question, using the sample (at block 308). For the purposes of the exemplary description below, it is assumed that the sample includes a plurality of transitions, each including two data points.

The updating of each diffusion parameter may be conducted by gradient descent on the deviance of the transitions in the sample. The diffusion's transitional density is calculated for each transition at the most recent diffusion parameter estimates and evaluated at the later of the transition's two data points.

Subsequently, the derivative of the log of the transitional density with respect to a particular diffusion parameter is calculated numerically whilst holding the other parameters at a weighted average of their recent estimates (or at other smoothed values). This may be done to control or minimise the variability of the estimates of the other parameters while updating a particular parameter estimate.

The number of recent estimates that constitute the weighted average may be chosen by the user 122. For instance, the more rapidly the user 122 believes the dynamics of the data stream is changing, the less deep into the past he or she may wish to reach in drawing estimates to create the weighted average. That is, parameter estimates that are older than a certain threshold may not be allowed to influence the current estimate as those older estimates may be a reflection of a data stream dynamic that is substantially different from the current dynamic.

It is understood that parameter estimates may not be available initially. Accordingly, the diffusion parameters may be initialized with random or other predefined starting values. The weighted averages may thus initially be biased by arbitrary starting values. However, over time, the stochastic gradient procedure typically converges to a set of values that are a more reliable representation of the data stream dynamic The smoothing or averaging of the other parameter estimates may be necessary in order to prevent the inherent variability in the estimate updating process from potentially introducing systematic biases in the estimates of a subset of the diffusion parameters.

An example is provided below, in which the parameter estimate is denoted by $\theta_i^{(j)}$. The updated parameter estimate is the number obtained after the "old" or "raw" parameter estimate is updated via gradient descent on a sampled set of transitions. The "raw estimate" may be contrasted with the weighted average of the parameter estimates for the other diffusion parameters, which are smoothed estimates of these diffusion parameters.

For example, the smoothed estimate of the i-th parameter at the r-th update, $\varepsilon^{(r)}[\theta_i]$ may be given by:

$$\varepsilon^{(r)}[\theta_i] = \begin{cases} \frac{1}{r-1}\sum_{i=1}^{r-1} \theta_i^{(j)} & r \leq p, \\ \sum_{j=r-p}^{r-1} \rho_{r-1}(j)\theta_i^{(j)} & r > p. \end{cases}$$

Here $\theta_i^{(j)}$ is the raw estimate of the i-th parameter after the j-th update and $\rho_{r-1}(j)$ is a distribution that decays as j decreases. The i-th parameter is updated at the r-th step by evaluating the transitional distribution at the sample observation with the following assumed values for the parameter vector:

$(\varepsilon^{(r)}[\theta_1], \ldots, \varepsilon^{(r)}[\theta_{i-1}], \theta_i^{(r)}, \varepsilon^{(r)}[\theta_{i+1}], \ldots, \varepsilon^{(r)}[\theta_k])^T$.

That is, with the exception of the diffusion parameter currently being updated, a smoothed estimate of existing parameters is inputted within the transitional density. The deviance may be derived using the resulting evaluations of densities. Gradient descent serves to update the parameters by moving each estimate in a direction that minimizes the deviance. This updating scheme may allow the diffusion model to adapt to changes in the stochastic dynamics and may thus enable real-time, short-term inference to be made reliably.

In some embodiments, e.g. in cases where the diffusion model is analytically intractable, the transitional density may be approximated.

The numerically-calculated partial derivative for the transitions in the sample are averaged and used to update a particular diffusion parameter. In cases where the sample includes only one transition, e.g. the most recent transition, the partial derivate may be used as is and no averaging or smoothing thereof is required.

It is understood that stochastic gradient descent is parallelizable. This means that the computer system 200 may include more than one processor, and, for instance, each processor could be assigned the task of calculating the partial derivative at a particular sampled transition for a particular parameter. After all the partial derivatives are calculated, the partial derivatives for each parameter may be averaged or otherwise combined. Thus, the parameters may be updated sequentially or in parallel.

The diffusion model is dynamically adapted to fit the data stream based on the updated parameter estimates (at block 310).

In the example of FIG. 3, the updating steps (block 305) are repeated each time a new observation is added to the data stream (at block 312). This permits adaptive estimation of the diffusion parameters of the diffusion model based on changing dynamics of the data stream. In other embodiments, the updating steps may be repeated periodically, e.g. at certain intervals, or after a predefined number or set of new observations.

In cases where the model is updated after each new observation, the model may be quicker to react to potential events of interest as opposed to cases where the model is updated periodically or after a certain number of new observations. The latter case may, on the other hand, be less computationally intensive.

Figure 5:
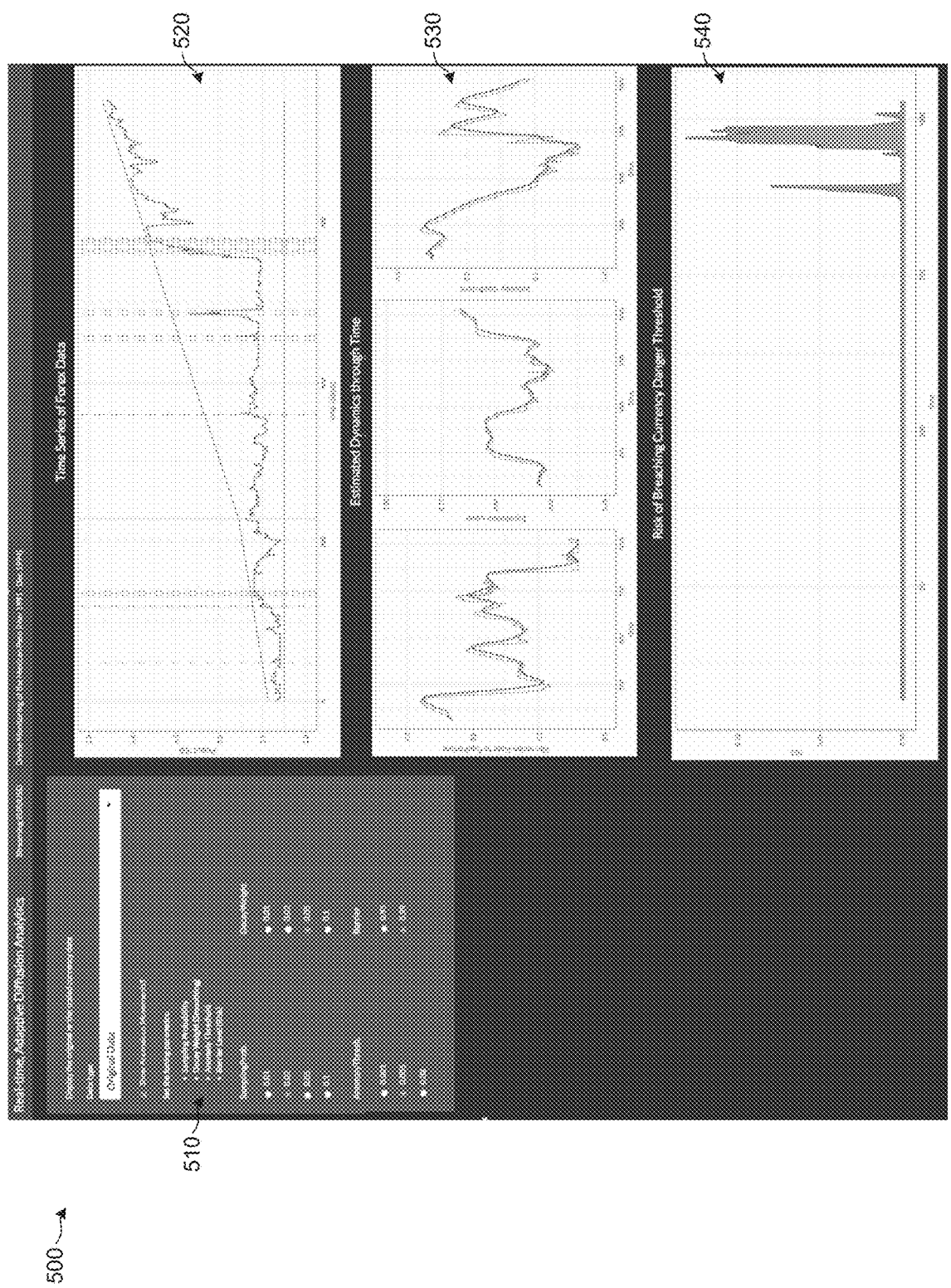
FIG. 5 illustrates an exemplary screenshot of online tool for data stream analysis, implemented in accordance with the method of FIG. 4.

A more specific example will now be further described in use, with reference to FIGS. 4 and 5.

The diagram 400 of FIG. 4 depicts a real-world financial market providing currency movements 402. These movements are tracked by a sensor 404 or data source in the form of a computer system, which outputs the movements as a data stream 406 that evolves over time. In this example, the data stream is the currency movement of the Mexican Peso against the US Dollar.

In FIG. 4, the symbol $T_0$ is used to indicate the present time. Only transitions within a sliding effective time window 408 associated with the data stream 406 are sampled. The window 408 has a fixed timespan, from $T_0$ backwards in time to $T_{-X}$, and thus slides forward as the data stream 406 evolves over time.

The data stream 406 is adaptively modeled in the manner described with reference to FIG. 3 (at block 410).

A forecasting module (e.g. the module 216) is used to forecast future data points associated with the data stream 406 using the dynamically updated parameter estimates for the diffusion parameters (at block 412).

A monitoring module (e.g. the module 218) is configured to detect predefined risk/opportunity events, regime shifts or anomalies associated with the data stream 406 (at block 414). In response to detecting a risk/opportunity event, regime shift or anomaly, an alert module (e.g. the module 219) is configured to provide an alert message to a user (e.g. the user 122), enabling user intervention or action to be carried out if required (at block 418). The risk/opportunity event, regime shift or anomaly may be associated with the future data points generated by the forecasting module 216.

In this example embodiment, an online tool 500 is provided for tracking currency movements. The online tool 500 may be provided as a graphical user interface (GUI) via a website. A user of the online tool may be the user 122 and may access the online tool via the telecommunications network 110. The website may be provided by a web server such as the web server 204 which may form part of or be connected or associated with the computer system 200.

The online tool 500 enables the user thereof to adjust certain parameters associated with the model (at panel 510) being fitted to the data stream. For instance, "Sampling-Prob." and "Decay/Weight" characterize the sampling distribution of the sampling scheme used.

In this example, the sampling distribution and sample size are predefined according to the behavior of the data stream. However, as mentioned above, the sampling scheme parameters may change dynamically according to model fit diagnostics that are calculated in real-time.

The tool 500 presents the user with three graph-based panels 520, 530, 540. The top panel 520 shows the actual data stream—the Mexican Peso against the US Dollar. As currency prices stream in, the tool 500 is configured to tag anomalous currency movements in real-time (see blocks 412, 414 and 416 in FIG. 4). These anomalous movements are highlighted by the dashed vertical lines in the top panel 520, serving as alert messages for the user's attention.

The central panel 530 shows the manner in which the tool 500 tracks the currency dynamics over time. The central figure of the central panel 530 shows the estimate of the true value of the scaled Peso through time. The right figure of the central panel 530 shows the estimate of the Peso's volatility against the dollar through time and the left figure of the central panel 530 shows reversion rate.

The bottom panel 540 shows a real-time risk measure. The Mexican government enforced currency bands on the Mexican Peso (shown in the top panel 520). The bottom panel 540 measures the risk of the Peso breaching the upper threshold that the government defined.

The Applicant believes that example embodiments of the present invention may provide at least some advantages.

The Applicant has found that embodiments of the invention provide an online estimation procedure specifically developed for diffusion models. The procedure may enable such models to follow changing dynamics driving a data stream by being updated substantially in real-time.

Embodiments of the invention may be well equipped to address the challenges that arise with high-velocity data streams.

The Markov assumption of the diffusion framework coupled with the use of a variant of the stochastic gradient algorithm may ensure that the scheme remains scalable. That is, as the frequency of a data stream increases, the computational cost of updating the model and the memory requirements may remain substantially constant.

The Markov property ensures that the objective function of a gradient descent algorithm may be decomposed into the sum of log probabilities of transitions. In embodiments of the invention, the time it takes to calculate the transitional density for an observed transition (and subsequently its derivative) does not grow as the number of observations in the data stream increases. Accordingly, in embodiments of the invention, the time it takes to update each parameter may be independent of the number of observations. This may be contrasted with, for example, linear regression, where the time to calculate ordinary least squares regression parameters may grow to the cube of the number of data points.

Whereas the standard stochastic gradient descent algorithm assumes that the sample size is fixed, the sample size may be constantly growing in the context of a data stream. Embodiments of the present invention provide a sampling scheme and/or latest observation update method (where only the most recent transition is sampled) ensuring that the scheme can adapt to changes in the dynamics of the data stream in a meaningful manner In one embodiment, a sample is drawn using the sampling distribution and the latest transition is subsequently included in the sample. Alternatively, the technique may involve dynamically changing between a sampling scheme and the latest observation update method. For instance, if the computational burden of tracking a data stream in real-time becomes too high, the scheme may shift from a sampling distribution to the latest observation update method (which may be less computationally intensive). In some embodiments, the scheme may provide flexibility to perform a simple latest observation update for parameters that are easy to estimate and to use the sampling scheme described herein for parameters where an informative update is otherwise of low probability.

Embodiments of the present invention are capable of dealing with non-equally spaced observations within data streams while also allowing for non-linear stochastic dynamics. The updating framework in accordance with embodiments of the invention may counter bias in a diffusion parameter estimate that may result from the inherent variability of model estimates.

Embodiments of the invention may allow for the allocation of additional computational resources at each updating step in order that the parameter in question may be more accurately estimated.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method comprising:
   receiving, by a receiving module of a computer processor, a plurality of data points forming part of a data stream;
   providing a predictive model to be fitted to the data stream, wherein the predictive model is a diffusion model having a plurality of diffusion parameters;
   updating, by an updating module of the computer processor, a parameter estimate for each of the diffusion parameters by:
     obtaining a sample of at least one transition from the data stream, wherein each transition is defined by at least two data points; and
     calculating an updated parameter estimate for the diffusion parameter using a stochastic gradient descent algorithm on the sample, wherein a partial derivative associated with the diffusion parameter at each transition is calculated while holding values associated with the other diffusion parameters at smoothed or weighted average estimates, and
   repeating, by the updating module, the updating periodically, or in response to one or more further data points being added to the data stream, of the parameter estimate for each one of the diffusion parameters, thereby to permit adaptive estimation of the diffusion parameters of the diffusion model based on dynamics of the data stream.

2. The method of claim 1, which further comprises receiving, by the receiving module, an indication of a sampling distribution associated with each one of the diffusion parameters and/or an indication of a sample size associated with each one of the diffusion parameters, and wherein the obtaining a sample comprises obtaining the sample in accordance with the sampling distribution associated with the diffusion parameter and/or including in the sample a number of transitions corresponding to the sample size associated with the diffusion parameter.

3. The method of claim 1, wherein the obtaining a sample comprises obtaining the sample in accordance with a sampling distribution, wherein the sampling distribution is defined by a sliding and/or decaying probability distribution that allocates higher selection probabilities to more recent data points in the data stream.

4. The method of claim 3, wherein the obtaining a sample comprises, in addition to obtaining the sample in accordance with the sampling distribution, obtaining a most recent transition defining a transition to a most recent data point in the data stream, such that the sample includes at least one transition obtained in accordance with the sampling distribution as well as the most recent transition.

5. The method of claim 3, wherein the sampling distribution is truncated so as to cause only transitions within a sliding effective time window associated with the data stream to be capable of being sampled.

6. The method of claim 1, wherein the obtaining a sample comprises obtaining a most recent transition defining a transition to a most recent data point in the data stream.

7. The method of claim 1, wherein the calculating an updated parameter estimate comprises, for each transition in the sample:
   calculating or approximating a transitional density for the transition;
   evaluating the transitional density at a most recent data point of the transition;
   calculating the partial derivative of the log of the transitional density with respect to the diffusion parameter while holding values associated with the other diffusion parameters at smoothed or weighted average estimates; and
   using the calculated partial derivate to update the parameter estimate for the diffusion parameter, wherein, if the sample includes a plurality of transitions, an average of or smoothed value for the partial derivatives calculated for the transitions is used to update the parameter estimate.

8. The method of claim 1, wherein the repeating the updating is carried out in response to each new data point of the data stream received by the receiving module.

9. The method of claim 1, which further comprises forecasting, by a forecasting module of the computer processor, future data points associated with the data stream using the parameter estimates for the diffusion parameters.

10. The method of claim 1, further comprising:
    detecting, by a monitoring module of the computer processor, a risk event, an opportunity event, a regime shift or an anomaly associated with the data stream; and
    providing, by an alert module of the computer processor, in response to detecting the risk event, opportunity event, regime shift or anomaly, an alert message or risk indication to a user.

11. A computer system comprising:
    a computer processor; and
    a computer readable storage medium having stored thereon program instructions executable by the computer processor to direct the operation of the processor in fitting a predictive model to a data stream, wherein the predictive model is a diffusion model having a plurality of diffusion parameters, and wherein the computer processor, when executing the program instructions, comprises:
       a receiving module configured to receive a plurality of data points forming part of the data stream; and
       an updating module configured to update a parameter estimate for each of the diffusion parameters by obtaining a sample of at least one transition from the data stream, wherein each transition is defined by at least two data points; and
          calculating an updated parameter estimate for the diffusion parameter by using a stochastic gradient descent algorithm on the sample, wherein a partial derivative associated with the diffusion parameter is calculated while holding values associated with the other diffusion parameters at smoothed or weighted average estimates,
       wherein the updating module is configured to repeat the updating of the parameter estimate for each one of the diffusion parameters periodically or in response to one or more further data points being added to the data stream, thereby to permit adaptive estimation of the diffusion parameters of the diffusion model based on dynamics of the data stream.

12. The computer system of claim 11, wherein the receiving module is configured to receive an indication of a sampling distribution associated with each one of the diffusion parameters and/or an indication of a sample size associated with each one of the diffusion parameters, and wherein the updating module is configured to obtain the sample of at least one transition from the data stream for each one of the diffusion parameters in accordance with the sampling distribution associated with the diffusion parameter and/or to include in the sample a number of transitions corresponding to the sample size associated with the diffusion parameter.

13. The computer system of claim 11, wherein the updating module is configured to obtain the sample of at least one transition from the data stream in accordance with a sampling distribution, wherein the sampling distribution is defined by a sliding and/or decaying probability distribution that allocates higher selection probabilities to more recent data points in the data stream.

14. The computer system of claim 13, wherein, in addition to obtaining the sample in accordance with the sampling distribution, the updating module is configured to obtain a most recent transition defining a transition to a most recent data point in the data stream, such that the sample includes at least one transition obtained in accordance with the sampling distribution as well as the most recent transition.

15. The computer system of claim 11, wherein the updating module is configured to obtain the sample of at least one transition from the data stream by obtaining at least a most recent transition defining a transition to a most recent data point in the data stream.

16. The computer system of claim 11, wherein the updating module is configured to calculate the updated parameter estimate for the diffusion parameter by, for each transition in the sample:
   calculating or approximating a transitional density for the transition;
   evaluating the transitional density at a most recent data point of the transition;
   calculating the partial derivative of the log of the transitional density with respect to the diffusion parameter while holding values associated with the other diffusion parameters at smoothed or weighted average estimates; and
   using the calculated partial derivate to update the parameter estimate for the diffusion parameter, wherein, if the sample includes a plurality of transitions, an average of or smoothed value for the partial derivatives calculated for the transitions is used to update the parameter estimate.

17. The computer system of claim 11, wherein the updating module is configured to repeat the updating of the parameter estimate for each one of the diffusion parameters in response to each new data point of the data stream received by the receiving module.

18. The computer system of claim 11, wherein the computer processor, when executing the program instructions, comprises a forecasting module configured to forecast future data points associated with the data stream using the parameter estimates for the diffusion parameters.

19. The computer system of claim 11, wherein the computer processor, when executing the program instructions, comprises:

a monitoring module configured to detect a risk event, an opportunity event, a regime shift or an anomaly associated with the data stream; and an alert module configured to provide an alert message or risk indication to a user in response to detecting the risk event, opportunity event, regime shift or anomaly.

20. A computer program product for adaptive modeling of a data stream, the computer program product comprising:

a computer readable storage medium having stored thereon:

first program instructions executable by a computer processor to cause the computer processor to receive a plurality of data points forming part of a data stream, wherein a predictive model is to be fitted to the data stream, and wherein the predictive model is a diffusion model having a plurality of diffusion parameters; and second program instructions executable by the computer processor to cause the computer processor to update a parameter estimate for each one of the diffusion parameters by obtaining a sample of at least one transition from the data stream, wherein each transition is defined by at least two data points; and calculating an updated parameter estimate for the diffusion parameter by using a stochastic gradient descent algorithm on the sample, wherein a partial derivative associated with the diffusion parameter is calculated while holding values associated with the other diffusion parameters at smoothed or weighted average estimates, wherein the second program instructions are executable by the computer processor to cause the computer processor to repeat the updating of the parameter estimate for each one of the diffusion parameters periodically or in response to one or more further data points being added to the data stream, thereby to permit adaptive estimation of the diffusion parameters of the diffusion model based on dynamics of the data stream.

* * * * *